(12) United States Patent
Maskaly et al.

(10) Patent No.: US 7,888,855 B2
(45) Date of Patent: Feb. 15, 2011

(54) MIXED SEMICONDUCTOR NANOCRYSTAL COMPOSITIONS

(75) Inventors: Garry R. Maskaly, Los Alamos, NM (US); Richard D. Schaller, Santa Fe, NM (US); Victor I. Klimov, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 422 days.

(21) Appl. No.: 12/218,716

(22) Filed: Jul. 16, 2008

(65) Prior Publication Data

US 2010/0013376 A1 Jan. 21, 2010

(51) Int. Cl.
*H01L 33/00* (2010.01)
*H01L 33/02* (2010.01)
*H01L 33/06* (2010.01)

(52) U.S. Cl. .................... 313/498; 313/499; 313/503; 252/500; 257/14; 257/103

(58) Field of Classification Search ......... 313/498–512; 257/42, 14, 88, 89, 100–103; 252/500
See application file for complete search history.

(56) References Cited

U.S. PATENT DOCUMENTS 6,501,091 B1 * 12/2002 Bawendi et al. ............... 257/14
2005/0129947 A1 * 6/2005 Peng et al. .................. 257/103

* cited by examiner

*Primary Examiner*—Mariceli Santiago
(74) *Attorney, Agent, or Firm*—Juliet A. Jones

(57) ABSTRACT

Composition comprising one or more energy donors and one or more energy acceptors, wherein energy is transferred from the energy donor to the energy acceptor and wherein: the energy acceptor is a colloidal nanocrystal having a lower band gap energy than the energy donor; the energy donor and the energy acceptor are separated by a distance of 40 nm or less; wherein the average peak absorption energy of the acceptor is at least 20 meV greater than the average peak emission energy of the energy donor; and wherein the ratio of the number of energy donors to the number of energy acceptors is from about 2:1 to about 1000:1.

34 Claims, 4 Drawing Sheets

MIXED SEMICONDUCTOR NANOCRYSTAL COMPOSITIONS

STATEMENT OF FEDERAL RIGHTS

The United States government has rights in this invention pursuant to Contract No. DE-AC52-06NA25396 between the United States Department of Energy and Los Alamos National Security, LLC for the operation of Los Alamos National Laboratory.

FIELD OF THE INVENTION

The present invention relates to compositions comprising semiconductor nanocrystals capable of accepting energy transferred from donor nanocrystals in close physical proximity thereto. The present invention further relates to white light emitting elements comprising nanocrystal donors and acceptors.

BACKGROUND OF THE INVENTION

Semiconductor nanocrystals (hereinafter "nanocrystals" or "NCs") are desirable for use in LEEs due to properties such as ease of tunability and high emission quantum yield (hereinafter "QY"). For use in an LEE, the nanocrystals preferably are incorporated into a dense film; however, nanocrystal use in LEE dense films suffers from disadvantages, such as reduced QY. Without being limited by theory, it is thought that, due to a distribution of QYs in a given NC ensemble, close proximity of nanocrystals allows undesirable energy transfer from high QY nanocrystals to any nearby low QY nanocrystals ("bad" energy transfer). Forster energy transfer is the most dominant energy transfer process that occurs between NCs and the rate of this process correlates to $r^{-6}$, where r is the distance between the centers of the NC's. This process generally results in loss of emission efficiency as well as a shifting of the emission spectrum to longer wavelengths, also known as "red shift."

Traditionally, solutions to this problem have focused on limiting the transfer of energy between nanocrystals, for example, by diluting the concentration of nanocrystals in the film. However, the presence of fewer nanocrystals leads to a lower probability of excitation, lower emitter density, and thus reduced brightness.

A need exists, therefore, for compositions comprising nanocrystals which do not exhibit reduced brightness and red-shifted emission when used in dense film LEE's.

SUMMARY OF THE INVENTION

The present invention meets the aforementioned need by providing compositions comprising suitable combinations of energy donors and nanocrystal acceptors that exhibit a resonant, non-radiative transfer of energy from a higher energy to a lower energy chromophore. One example of such an energy transfer is known as fluorescence resonance energy transfer (FRET), or Forster energy transfer. Without wishing to be limited by theory, in nanocrystals, energy is dictated by the NC-size-dependent electronic band gap, which correlates to the energy separation between the conducting band and the valence band. See, for example, C. B. Murray et al., "Synthesis and characterization of nearly monodisperse CdE (E=S, Se, Te) semiconductor nanocrystallites," *J. Am. Chem. Soc.* v. 115, p. 8706 (1993). Smaller NCs exhibit larger electronic band gaps. Typically, energy transfer takes place between a higher energy "donor" and a lower energy "acceptor." In the present invention, the donor chromophore may be either a nanocrystal or a non-nanocrystal chromophore such as an organic or inorganic dye molecule.

The following represent some non-limiting embodiments of the present invention.

According to a first embodiment of the present invention, a composition is provided, comprising one or more energy donors and one or more energy acceptors, wherein energy is transferred from the energy donor to the energy acceptor and wherein: the energy acceptor is a colloidal nanocrystal having a lower band gap energy than the energy donor; the energy donor and the energy acceptor are separated by a distance of 40 nm or less; wherein the average peak absorption energy of the acceptor is at least 20 meV greater than the average peak emission energy of the energy donor; and wherein the ratio of the number of energy donors to the number of energy acceptors is from about 2:1 to about 1000:1.

According to another embodiment of the present invention, a white-light emitting element is provided, comprising a composition in the form of a dense film, said composition comprising one or more nanocrystal energy donors and one or more nanocrystal energy acceptors, wherein energy is transferred from the energy donor to the energy acceptor and wherein: the energy acceptor molecule has a lower band gap energy than the energy acceptor; the energy donor and the energy acceptor are separated by a distance of 40 nm or less; wherein the average peak absorption energy of the acceptor molecule is at least 20 meV greater than the average peak emission energy of the energy donor; wherein the ratio of the number of energy donors to the number of energy acceptors is about 2:1 to about 100:1; and the film has a thickness of from about 1 nm to about 1 mm;

Applicants have found that suitable combinations of donors and acceptors may be used to produce enhanced-efficiency, dense film LEEs (where the film dimensionality is 2- or 3-dimensional). The components of the LEE's may be either photo-excited (i.e., an optical barcode, scintillator, optical tag, or an LED color-conversion element wherein the emission of a high-efficiency solid-state LED such as GaN is converted to a desired spectral profile such as white-light), or electrically excited (i.e, a traditional LED where carriers are electrically injected). Rather than seeking to minimize "bad" energy transfer, the present invention utilizes suitable pairs of donors and acceptors, in which donors transfer energy to a given acceptor rather than to any random acceptor that is in proximity. This allows control of energy transfer between donors and acceptors, and results in a number of advantages.

First, the overall NC density can be maximized giving higher overall film absorbance, electrical conductivity, and emitter density. In previous approaches, NC's would be diluted to increase the distance therebetween, and thus minimize "bad" energy transfer. Another reason for dilution is to reduce reabsorption of emitted photons by either donors or acceptors. In the present invention, absorption occurs both in acceptors and donors; however, emission occurs primarily from acceptors as the ratio of donors to acceptors is optimized, which in turn optimizes energy transfer. Referring to FIG. 1, the small circles represent NC donors whereas the larger circles represent NC acceptors. The present invention allows for a much higher density, or concentration, in a film (FIG. 1*b*) than in solution (1*a*). Furthermore, the donors do not reabsorb to any appreciable extent the emission of the acceptors, which allows a high absorption cross-section for the film while avoiding reduced efficiency due to energy transfer and reabsorption. This is particularly important for photoexcited LEEs, and further allows for the production of thick film, high-efficiency LEEs which are necessary for scintillators and color-conversion elements.

Second, the emission profile of the solid film device cans be readily controlled to maintain the emission profiles and carrier lifetimes of one or more acceptor NCs in a state similar to that typically only observed in solution-based, or dilute, systems (wherein energy transfer is typically inactive). This prevents emission profiles from being uncontrollably shifted to a longer wavelength (i.e., "red-shifted") in films relative to solutions. This simplifies the manufacturing control over spectral position and profile, as it is comparable to the solution properties, and also allows for multiple acceptor spectral profiles. A typical dense film of multiple NCs would show efficient energy transfer from the donor NCs indiscriminately to all nearby acceptor NCs of lower band gap energy, resulting in nearly zero emission from the higher band gap NCs and poor control of the resulting spectral profile and position. The current invention circumvents this by using donors which are paired with, or in effect surround, the acceptor NC. The donors serve to funnel energy to the acceptors. This strategy can be used to isolate acceptors from one another, reducing acceptor-acceptor energy transfer, which increases control of the spectral properties of the LEE. For example, a desired emission profile can be produced in solution by mixing multiple NC acceptors to obtain desired emission properties (i.e, a spectral barcode or white-light emission of red, green, and blue nanocrystals) with suitable donors. In the current invention a single film can be used to produce white light. This is simpler than many white light technologies that rely on either red, green, and blue layers or pixels. Films produced via this method will produce a nearly identical spectral profile to the acceptors in solution.

Third, in the present invention only the acceptors are required to be of high quality. In existing typical NC LEEs, a narrow spectral profile requires the use of highly monodisperse (i.e., nearly identical in size) NCs. This results in higher costs and reproducibility issues. Producing monodisperse, high QY NCs typically requires the production of smaller batches (<10 g) of NCs which also have batch-to-batch variations. The present invention allows the use of low-quality (i.e., poorly size-controlled and correspondingly broad spectral properties), mass-producible, low-cost, and/or lower-toxicity donors, as the emission properties of the donors are unimportant and the donors instead simply absorb and transfer their energy to fewer high-quality (i.e., narrow spectral profile and/or high QY) acceptors. Donors that are produced in larger quantities (>10 g) or through continuous methods where size-control may not be as refined can also be utilized. Acceptors can be produced through various higher-quality synthesis routes yielding high monodispersity and the desired spectral profiles. The resulting mixed films thus potentially offer cost savings, lower toxicity, lower quality-control, and more facile reproducibility.

Thus, rather than limiting the transfer of energy between nanocrystals, the present invention controls and optimizes energy transfer to increase quantum yield, decrease re-absorption of energy, and increase the control of the spectral properties. The result is a nanocrystal-containing dense film, suitable for use in LEEs, which has the properties of a film (high chromophore density) with the advantages of a solution (high QY and easily controlled spectral properties). Such films, moreover, are useful in photovoltaics for separation of multiple excitons following the generation of multiple excitons from a single photon in a donor NC, and also in optical amplifiers for the generation of multiple excitons (a population inversion) in acceptor NCs. In addition, the compositions of the present invention are useful in other applications in which undesirable energy transfer to or from nanocrystals may have a detrimental effect, for example, in gamma ray detectors, solar cells, and lasers, to name a few.

BRIEF DESCRIPTION OF THE DRAWINGS

In FIG. 3a, free clusters containing two or three components in solution that are bound together are shown. FIG. 3b depicts a film of NCs consisting of multiple sizes. FIG. 3c depicts a NC with a dye-based ligand.

DETAILED DESCRIPTION OF THE INVENTION

Figure 1:
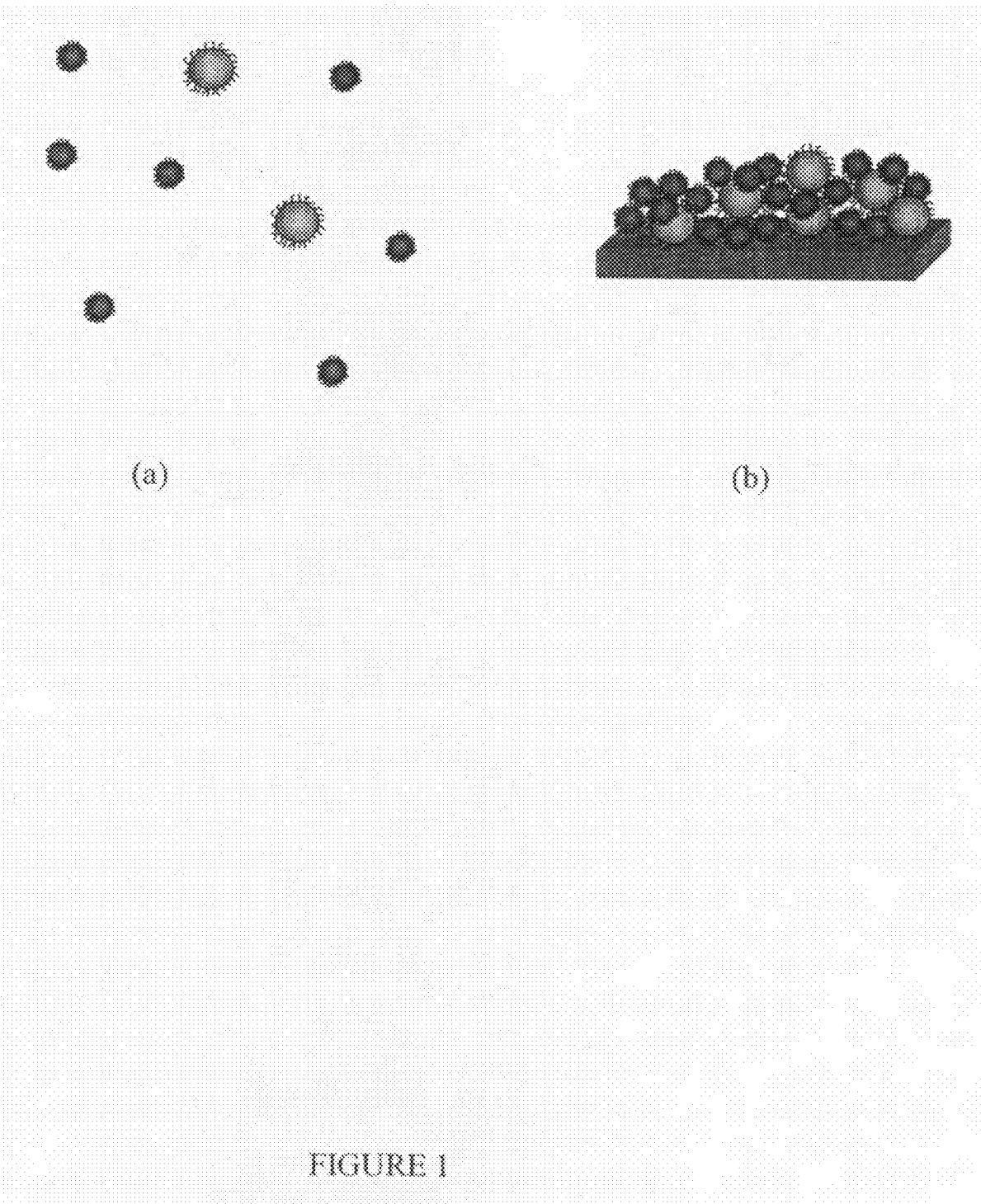
FIG. 1 is a schematic depiction of NC's in solution (1a) and NC's in a thick film (1b).
Figure 2:
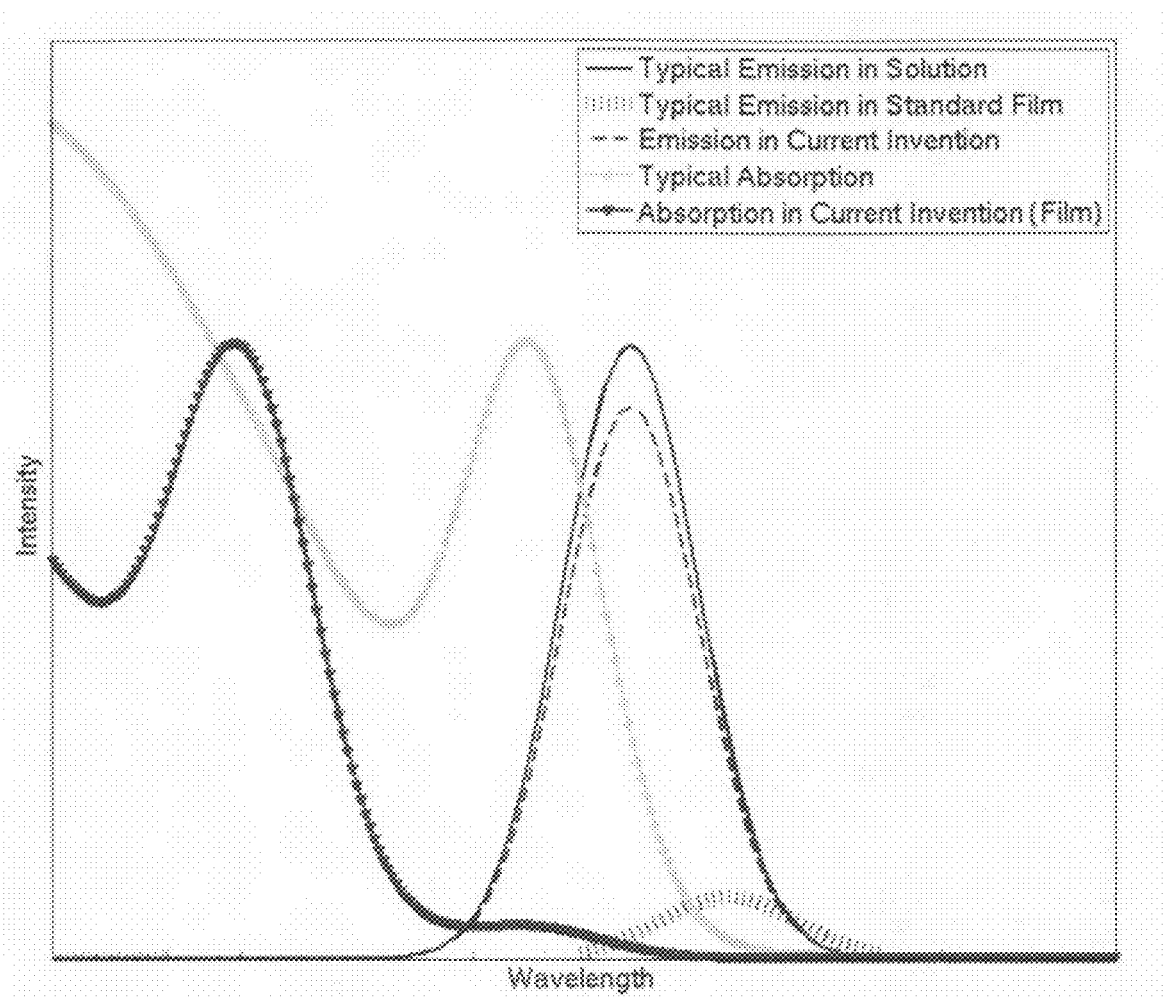
FIG. 2 compares the absorption and emission intensities (y-axis) vs. wavelength (x-axis) and the effect of a shifted emission wavelength ("red shift" or Stokes shift), of a typical nanocrystal material to the NC's of the present invention.
Figure 3:
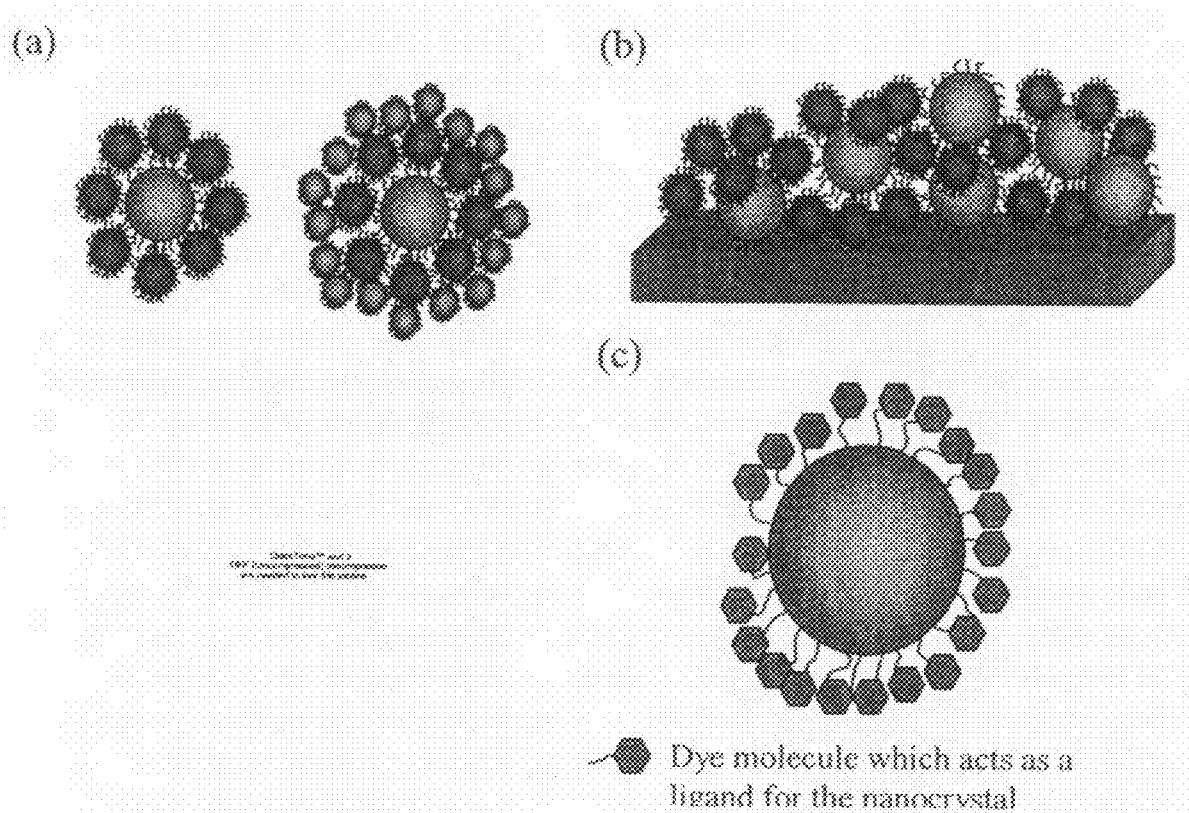
FIG. 3 depicts some non-limiting examples of systems wherein energy transfer pumping can be utilized.
Figure 4:
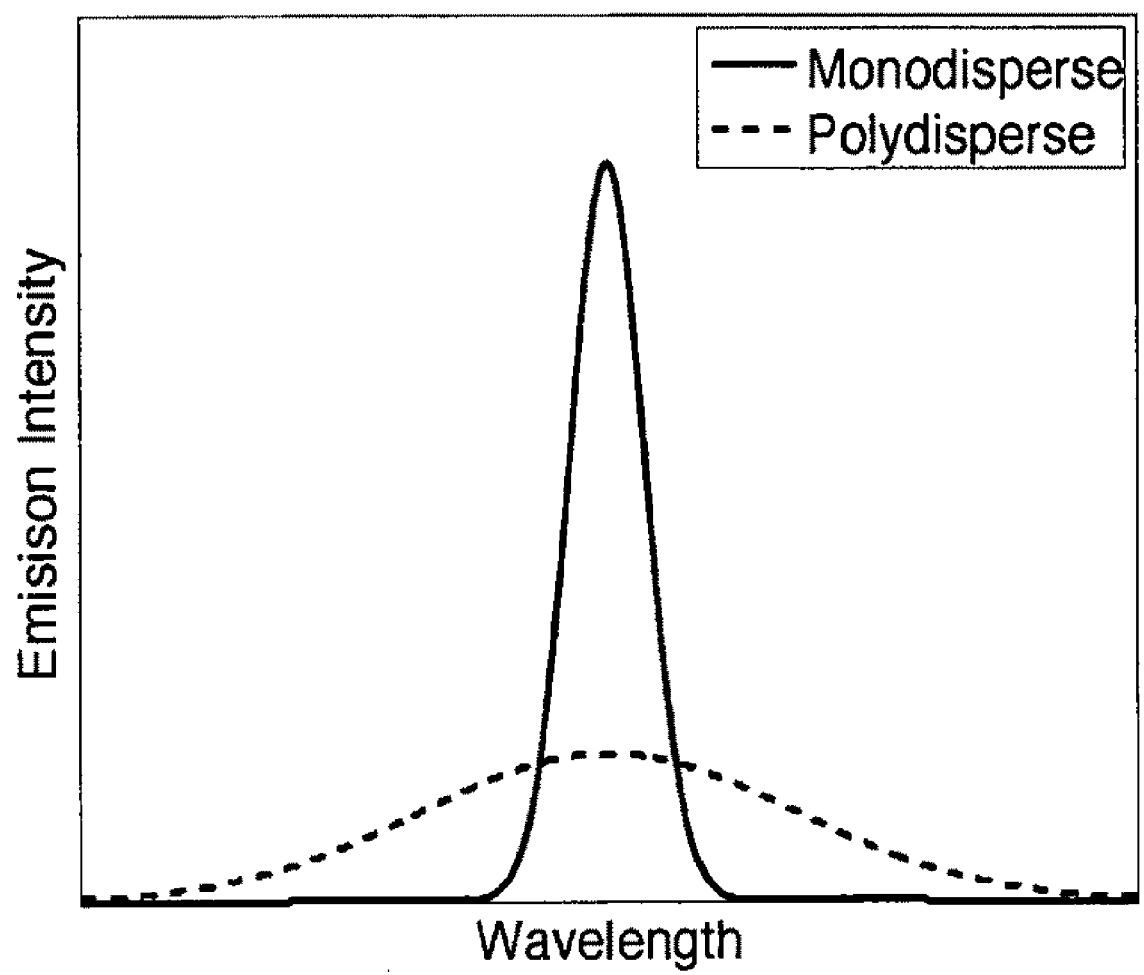
FIG. 4 compares the emission spectrum obtained from monodisperse NC's to polydisperse NC's.

The present invention describes compositions useful in dense film light emitting elements (LEEs) and also in other applications where increased emission quantum yield is desirable, for example in lasers and gamma ray scintillators. A photovoltaic application is also described wherein separation of multiple excitons is needed for increased photocurrent. The compositions comprise energy donors and acceptors, understood herein to include nanocrystals. The compositions effectively enhance excitation of desired emitters (i.e., enhanced emission at desired acceptor wavelengths) in the case of particle, photon, and electrical excitation. For example, high absorption of excitation absorbed by both donors and acceptors is maintained, while reducing reabsorption of acceptor emission in the film by acceptors. The compositions effectively enhance acceptor emission by utilizing donors that may, for example, have a wide range of absorption energies, which then transfer energy to the acceptors.

As used herein, "light emitting element," or "LEE," means a portion of a device that produces the desired light emission from a device. This includes light-emitting diodes, optical amplifiers, color-conversion elements, or other emissive regions in a device.

As used herein, "nanocrystal," "nanocrystal quantum dot," and "semiconductor nanocrystal" can be used interchangeably. All such terms refer to particles less than about 40 nanometers in the smallest axis (the quantum confined dimension), and typically from about 1 nm to about 20 nm. The nanocrystals of the present invention may be colloidal nanocrystale or colloidal nanocrystal quantum dots. Colloidal NC's may be prepared by standard organometallic colloidal methods as described in (insert reference); however, these techniques may also be applied to epitaxial quantum dots.

As used herein, "dense film" means a composition in the form of a film that has a percentage by volume of nanocrystals per unit volume of film of >1%.

As used herein, "average peak absorption energy" and "average peak emission energy" mean one or more maxima in a spectrum, corresponding to energy absorbed or emitted.

As used herein, "FWHM" means "full width at half maximum," and refers to the width of a spectral peak at half the maximum height of a peak.

As used herein, "monodisperse" means a collection of nanocrystals with a substantially uniform particle dimension. When the nanocrystal is substantially spherical, the standard deviation of the mean dimension along the quantum confined axis or axes is no more than about 15%, and the quantum confinement is in all spatial directions. When the NC has a shape other than spherical (for example rod-shaped), each quantum confined axis (e.g. in the length and the diameter), may have different standard deviations, the average of which should be no more than about 30%.

As used herein, "polydisperse" means a collection of nanocrystals having substantially non-uniform particle dimensions. When the nanocrystals are substantially spherical, "polydisperse" means that the standard deviation of the mean dimension along the quantum confined axis or axes is greater than 15%. When the nanocrystal has a shape other than spherical, each quantum confined axis may have different standard deviations, the average of which should be no more than about 20%. Additionally or alternatively, polydisperse nanocrystals may be characterized by an emission spectrum that exhibits a multimodal distribution, meaning that the emission spectrum resulting from a collection of polydisperse NC's of the same type may exhibit one or more broad peaks, or a multitude of narrower peaks (which can commonly occur from multiple nucleation events during synthesis).

Energy Acceptors and Donors

The composition of the present invention comprises one of more energy donors ("donors") and one or more energy acceptors ("acceptors"). In order to facilitate transfer of energy, the energy acceptor must have a smaller band gap energy (i.e., smaller band gap, or lower energy) than the energy donor. The energy donor and acceptor may be of the same or different chemical species. When the energy donor and acceptor are the same chemical species (for example, both are the same composition), then the size of the donor must be sufficiently smaller than that of the acceptor to allow transfer of energy. The energy donor and acceptor must be in sufficiently close proximity, e.g. 40 nm or less, to allow a sufficient amount of energy to be transferred before the exciton recombines in the donor (either radiatively or non-radiatively). In one embodiment, the energy donor and acceptor are attached by a covalent linkage (i.e., are covalently bound) to create a substantially fixed separation distance.

The acceptors and donors have distinct absorption and emission spectra, containing one or more peaks. In the composition of the present invention, the average peak emission energy of the acceptor must be sufficiently separated from the average peak absorption energy of the energy donor, so as to prevent substantial reabsorption of the emitted photons from the acceptor. In one embodiment, the average peak emission energy of the acceptor molecule is at least 20 meV greater than the average peak absorption energy of the energy donor. The difference between the energies of the donor and acceptor is not limited and will be tailored to specific applications. For example, the separation will be greater than 1 eV for donors with a band gap absorption onset in the ultraviolet (>3 eV) to red light (~1.7 eV) emitters, but also can be very small with energy transferring from nanocrystal donors having an onset in the red portion of the electromagnetic spectrum (~1.7 eV) to infrared light emitting acceptors (~1.5 eV), giving a separation of 200 meV.

The energy donor may be a nanocrystal, a dye, or combinations thereof, and preferably has a broad range of absorption energy. The desired range of absorption will vary according to the intended use of the composition, and may be for example 100 meV to about 500 meV, alternatively 100 meV to about 300 meV, and alternatively from about 300 meV to about 500 meV.

The range of emission energies of the donor should overlap or coincide with the range of energy absorption of the acceptor. In addition, the energy acceptor has a narrow range of energy emission. In one embodiment, average peak emission energy of the energy donor and the energy acceptor has an FWHM of about 150 meV or less, and alternatively of from about 20 meV to about 50 meV.

In one embodiment, the composition comprises a greater number of energy donors than energy acceptors. The ratio of the number of donors to the number of acceptors will vary according to the intended use of the composition, and may vary from about 2:1 to about 1000:1. When the composition is used in an LED, the ratio of the number of donors to the number of acceptors may be from about 2:1 to about 100:1, alternatively from about 2:1 to about 20:1, and alternatively may be from 3:1 to 10:1. When the composition is used, for example, in a gamma ray detector, the ratio of the number of donors to the number of acceptors may be from about 2:1 to about 1000:1 and alternatively from about 5:1 to about 50:1.

The energy acceptors and donors may comprise colloidal nanocrystals. The colloidal nanocrystals may be monodisperse or polydisperse. In one embodiment the energy donors are polydisperse and the energy acceptors are monodisperse. In one embodiment, both the energy acceptors and donors are monodisperse. The shape of the colloidal nanocrystals may be spherical ellipsoidal, polyhedral, rod-like, cube-like, ribbon-like, disk-like, and the mixture of nanocrystals may comprise combinations thereof, whereby it is understood that while the crystals are not perfect spheres, their appearance is substantially spherical and the particles are typically characterized by the radius.

The nanocrystals can be comprised of a semiconductor-core with a surface that is largely terminated by organic or organometallic molecules, or a semiconductor-core completely or partially terminated with a different composition semiconductor shell (which then can have additional materials on the outer semiconductor surface). In one embodiment, the colloidal nanocrystals include a core of a binary semiconductor material, e.g., a core of the formula MX, where M can be, but is not limited to, cadmium, zinc, mercury, aluminum, lead, tin, gallium, indium, thallium, magnesium, calcium, strontium, barium, copper, silver, and mixtures or alloys thereof and X can be, but is not limited to, sulfur, selenium, tellurium, nitrogen, phosphorus, arsenic, antimony or mixtures thereof. In another embodiment, the colloidal nanocrystals include a core of a ternary semiconductor material, e.g., a core of the formula $M_1M_2X$, and alternatively may be a quaternary semiconductor material, e.g., a core of the formula $M_1M_2M_3X$; and alternatively may be an alloy of up to six cations (M) and up to six anions (X), and where M may be, but is not limited to, cadmium, zinc, mercury, aluminum, lead, tin, gallium, indium, thallium, magnesium, calcium, strontium, barium, copper, silver, and mixtures or alloys thereof and X may be, but is not limited to, oxygen, sulfur, selenium, tellurium, nitrogen, phosphorus, arsenic, antimony or mixtures thereof. In another embodiment, semiconductor NCs comprise a core with formula $M_1X_1$ and a shell with formula $M_2X_2$, wherein the shell material may act as an energy donor and the core may act as the acceptor, and vice versa.

In another embodiment, the colloidal nanocrystals include a core of a, where $M_1$, $M_2$ and $M_3$ can predominantly be, but are not limited to, cadmium, zinc, mercury, aluminum, lead, tin, gallium, indium, thallium, magnesium, calcium, strontium, barium, copper, silver, and mixtures or alloys thereof and X can be, but is not limited to, oxygen, sulfur, selenium, tellurium, nitrogen, phosphorus, arsenic, antimony or mixtures thereof. In one embodiment, the colloidal nanocrystals are of silicon, germanium, or alloys therefore, or of tellurium, selenium, or alloys thereof. In another embodiment, the nanocrystal can predominantly consist of, but is not limited to, cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury selenide (HgSe), mercury telluride (HgTe), aluminum nitride (AlN), aluminum sulfide (AlS), aluminum phosphide (AlP), aluminum arsenide (AlAs), aluminum antimonide (AlSb), lead sulfide (PbS), lead selenide (PbSe), lead telluride (PbTe), gallium arsenide (GaAs), gallium nitride (GaN), gallium phosphide (GaP), gallium antimonide (GaSb), indium arsenide (InAs), indium nitride (InN), indium phosphide (InP), indium antimonide (InSb), thallium arsenide (TlAs), thallium nitride (TlN), thallium phosphide (TlP), thallium antimonide (TlSb), zinc cadmium selenide (ZnCdSe), indium gallium nitride (InGaN), indium gallium arsenide (InGaAs), indium gallium phosphide (InGaP), aluminum indium nitride (AlInN), indium aluminum phosphide (InAlP), indium aluminum arsenide (InAlAs), aluminum gallium arsenide (AlGaAs), aluminum gallium phosphide (AlGaP), aluminum indium gallium arsenide (AlInGaAs), aluminum indium gallium nitride (AlInGaN), silver sulfide ($Ag_2S$), silver selenide ($Ag_2Se$), silver telluride ($Ag_2Te$), and the like, mixtures of such materials, or any other semiconductor or similar materials. Inorganic shell materials can consist of, but are not limited to, cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury selenide (HgSe), mercury telluride (HgTe), aluminum nitride (AlN), aluminum sulfide (AlS), aluminum phosphide (AlP), aluminum arsenide (AlAs), aluminum antimonide (AlSb), lead sulfide (PbS), lead selenide (PbSe), lead telluride (PbTe), gallium arsenide (GaAs), gallium nitride (GaN), gallium phosphide (GaP), gallium antimonide (GaSb), indium arsenide (InAs), indium nitride (InN), indium phosphide (InP), indium antimonide (InSb), thallium arsenide (TlAs), thallium nitride (TlN), thallium phosphide (TlP), thallium antimonide (TlSb), zinc cadmium selenide (ZnCdSe), indium gallium nitride (InGaN), indium gallium arsenide (InGaAs), indium gallium phosphide (InGaP), aluminum indium nitride (AlInN), indium aluminum phosphide (InAlP), indium aluminum arsenide (InAlAs), aluminum gallium arsenide (AlGaAs), aluminum gallium phosphide (AlGaP), aluminum indium gallium arsenide (AlInGaAs), aluminum indium gallium nitride (AlInGaN), silver sulfide ($Ag_2S$), silver selenide ($Ag_2Se$), silver telluride ($Ag_2Te$), and the like, mixtures of such materials, or any other semiconductor or similar materials. Furthermore, nanocrystals can be comprised of a gradation between two or more of the above material compositions or of multiple shells of two or more of the above compositions. In another embodiment, the colloidal nanocrystals include a core of a metallic material such as gold (Au), silver (Ag), cobalt (Co), nickel (Ni), copper (Cu), manganese (Mn), and alloys thereof.

Finally, the nanocrystals can contain a dopant element or elements to alter the electronic band structure or can contain rare-earth dopants to serve as atomic emitters. Non-limiting examples of suitable dopants include yttrium, manganese, or erbium as atomic emitters and phosphorus or nitrogen as electronic dopants.

In one embodiment, the energy donor and/or acceptor predominantly are comprised of Si, Ge, Sn, Te, SiC, ZnS, ZnSe, ZnTe, CdS, CdSe, CdTe, HgS, HgSe, HgTe, MgS MgSe, MgTe, CuS, CuSe, CuTe, SrS, SrSe, SrTe, BaS, BaSe, BaTe, GaN, GaP, GaAs, GaSb, InN, InP, InAs, InSb, AlAs, AlP, AlSb, AlS, $Ag_2S$, $Ag_2Se$, $Ag_2Te$, Ge, Si, PbS, PbSe, PbTe, $TiO_2$, $SnO_2$, $WO_3$, SiC, and mixtures thereof. In another embodiment, the energy donor comprises ZnX and/or CdX, wherein X is selected from the group consisting of S, Se, Te and combinations thereof. In another embodiment, the energy acceptor is CdY and/or PbY, wherein Y is selected from the group consisting of S, Se, Te and combinations thereof. In another embodiment, the energy donor is CdSe and the energy acceptor is InAs; alternatively the energy donor is CdSe and the energy acceptor is PbSb; and alternatively the energy donor is ZnSe and the energy acceptor is CdSe.

The energy donor may comprise other compounds having a higher energy (and thus a larger band gap) than the energy acceptor. For example, the energy donor may be a dye molecule. Non-limiting examples of suitable dyes include, but are not limited to, rhodamines, coumarins, stilbenes, fluoresceins, porphyrins, aromatic hydrocarbons, and combinations thereof.

The composition of the present invention may be in a variety of forms, including free clusters of donors covalently bound to acceptors in solution, dense films, drop cast films, powders, superlattices, and/or embedded within a sol-gel or polymer matrix. When the composition is used as an LEE or in a gamma ray detector, the composition is typically in the form of a dense film or block. In one embodiment, the composition may comprise 75% or less by volume of energy donors and acceptors. Alternatively, the composition may comprise from about 1% to about 75% of donors and acceptors, and alternatively may comprise from about 10% to about 30% of donors and acceptors. In one embodiment, the film comprises at least 10% by volume of energy acceptor molecules.

The average thickness of the film may vary widely, depending upon the intended use of the film. For example, when the film is used in a color-conversion element for a solid-state LED, the average thickness may be from about 1 nm to about 1 mm. When the film is used in a gamma ray detector, the thickness may be from about 1 cm to about 50 cm.

The film may comprise additional materials that would be understood to be desirable by one of skill in the art, for example, polymer, a sol-gel, a conductive material, etc.

In one embodiment, the film is used as a color conversion element coupled with another light-emitting device. For example, a GaN LED may be used, which emits light absorbed primarily by the donors that do not emit substantially in the visible wavelengths (including but not limited to ZnS, ZnSe, or ZnTe). These donors then transfer energy to acceptors of lower energy that emit with the desired spectrum. (including but not limited to CdSe, CdS, CdTe, PbS, or PbSe). The acceptors are substantially surrounded donors so as to prevent energy exchange between acceptors, which prevents red-shifting of acceptor emission and resulting energy loss from acceptor-acceptor transfer. Excited donors are in close proximity to acceptors, thus providing efficient energy transfer from donors to acceptors and reducing losses from donor emission or donor-donor energy transfer. For optimum efficiency, the ratio of donors to acceptors ratio is from about 2:1 to 20:1. The film may have either one type of acceptor, typically giving a single emission peak, or may have a mixture of several types of acceptors allowing the production of tailored spectra for white light. For example, a 470-nm emitting CdS NC, a 520-nm emitting CdSe NC, and a 620-nm emitting CdSe NC may be mixed together in solution in ratios suitable to produce white light emission. ZnS NCs may then be added in a ratio of about 10 ZnS NC's:1 part CdSe NC's of varying wavelength. A film is then produced on a high-efficiency GaN light emitting diode. The resulting device shows a very high color conversion efficiency of the GaN emission to white light emission. In another example, a mixture of several sizes of PbSe nanocrystals exhibiting IR emission may be mixed with ZnS to give a specific infrared signature emission when illuminated with ultraviolet light.

If energy transfer rates are sufficiently fast, due to well-tailored donor-acceptor energy transfer, the energy transfer can begin to compete with Auger processes. For example, all acceptors can gain one exciton (excited state) giving nearly optical transparency at the acceptor emission wavelength (no loss or gain for that wavelength). As the donors can still be excited, they can transfer in more excitons on the time-scale of the energy transfer rate, which results in a prolonged gain lifetime. Any acceptors that spontaneously emit upon return to a ground-state can also be replenished. In effect, the film behaves with a long-lived intermediate state (near the acceptor emission energy) from which lasing occurs and is excited at the donor wavelength (at a much higher energy). The longer gain-lifetimes provide a means for nanocrystals to begin to compete with the lifetimes of organic and inorganic laser dyes. As opposed to nanocrystal laser prior to this work, the gain lifetime is not limited by the Auger recombination rate of the nanocyrstal, but is instead limited by the radiative lifetime of the donor nanocrystal (as this determines when all the excitation is depleted) and its coupling to the acceptor nanocrystal. This device provides a high absorbance at the exciton energy provided by the donors while funneling energy to acceptors, which emit a wavelength that has little reabsorption and therefore loss. The device also provides a non-Poissonian distribution of states (where a nanocrystal film of a single component has some number unexcited, some number singly excited, and some number doubly excited as given by a Poisson distribution) giving most carriers in a singly excited state with few lasting in an unexcited state and a continued replenishing of carriers in a doubly excited state. This non-Poissonian distribution also enhances the performance of the film for laser applications.

In another embodiment, rapid energy transfer can be used to increase the power conversion efficiency of a photovoltaic or photodiode. If energy transfer rates are sufficiently fast due to well-tailored donor-acceptor energy transfer, such that energy transfer can compete with Auger recombination processes, energy transfer may be used to rapidly separate multiple excitons that are contained within individual donor NCs. Multiple excitons may be formed within individual NCs upon absorption of a single photon of sufficient energy. Energy transfer can separate multiple excitons contained within a donor NC such that increased time is available for subsequent dissociation of single excitons in comparison to Auger recombination processes.

In another embodiment a mixture of donor and acceptor nanocrystal materials is used to produce photoemission as a result of interaction with energetic particles such as a gamma ray or neutron. A gamma ray scintillator may be made which utilizes as a donor material a high average Z nanocrystal which interacts strongly with gamma rays material (one example of which being HgSe). In proximity to the donor material are CdSe nanocrystals which act as energy acceptors. The HgSe aids in the formation of electron-hole pairs that are transferred downhill energetically to the CdSe nanocrystals which act to emit light that is detected with a photomultiplier tube, avalanche photodiode, or other photodetector. The acceptors are separated from one another by donors to preventing red-shifting of acceptor emission and resulting energy loss from acceptor-acceptor transfer. Excited donors are packed closely near acceptors providing efficient energy transfer from donors to acceptors, reducing losses from donor emission or donor-donor energy transfer. For optimal efficiency, the donor to acceptor ratio may be from about 2:1 to 20:1. The reduced number of acceptors in the mixture aids in reducing reabsorption of acceptor emission through the thick scintillator material, which may have a thickness of from about 1 cm to about 10 cm.

In all embodiments of the present invention, all percentages are by weight of the total composition, unless specifically stated otherwise. All ratios are weight ratios, unless specifically stated otherwise. All ranges are inclusive and combinable. All numerical amounts are understood to be modified by the word "about" unless otherwise specifically indicated.

All documents cited in the Detailed Description of the Invention are, in relevant part, incorporated herein by reference; the citation of any document is not to be construed as an admission that it is prior art with respect to the present invention. To the extent that any meaning or definition of a term in this document conflicts with any meaning or definition of the same term in a document incorporated by reference, the meaning or definition assigned to that term in this document shall govern.

Whereas particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

EXAMPLE 1

5 g of 5-nm diameter ZnTe NCs (donors) capped with trioctylphosphine/trioctylphosphine-oxide are dissolved in 25 mL of chloroform. 1 g of 5-nm diameter CdSe NCs (acceptors) capped with trioctylphosphine/trioctylphosphine-oxide and is added to the ZnSe NC solution. 12 g of polymethylmethacrylate (PMMA) is then dissolved in 20 mL of chloroform and added to the mixed-NC solution. The mixture is then poured into a glass form and the solvent is evaporated to produce a solid form. The PMMA helps the solid to retain good optical properties (low scatter) and also causes the NCs to aggregate together such that energy transfer takes place between the donors and acceptors.

EXAMPLE 2

5 g of polydisperse ZnTe NCs (donors) capped with trioctylphosphine/trioctylphosphine-oxide are dissolved in 25 mL of chloroform. 1 g of 5-nm diameter CdSe NCs (acceptors) capped with trioctylphosphine/trioctylphosphine-oxide and is added to the ZnSe NC solution. The solution is dried and an octane:hexane mixture is returning the solution to the original volume (this allows for high quality drop cast and spin coated films). The resulting mixture is deposited on a GaN LED via spin coating for use as a color conversion element layer.

EXAMPLE 3

3 g of 3-nm diameter ZnSe NCs (donors) capped with trioctylphosphine/trioctylphosphine-oxide are dissolved in 30 mL of chloroform. 500 mg of 2.5-nm diameter CdSe NCs (acceptor #1) capped with trioctylphosphine/trioctylphosphine oxide 500 mg of 3.5-nm diameter CdSe NCs (acceptor #2) capped with trioctylphosphine/trioctylphosphine-oxide, and 500 mg of 7-nm diameter CdSe NCs (acceptor #3) capped with trioctylphosphine/trioctylphosphine-oxide are added to the ZnSe NC solution. The mixture stirred and then drop casted onto a glass plate and the solvent is evaporated to produce a solid form. The resulting mixture will have multiple narrow emission peaks from the multiple acceptors and can be tuned to produce white light emission.

EXAMPLE 4

Ultraviolet-Excited Infrared-Barcode-Emission Via Multiple Acceptors 3 g of 3-nm diameter ZnS NCs (donors) capped with trioctylphosphine/trioctylphosphine-oxide are dissolved in 30 mL of chloroform. 100 mg of 3.5-nm diameter PbS NCs (acceptor #1) capped with oleic acid, 100 mg of 5-nm diameter PbS NCs (acceptor #2) capped with oleic acid, and 10 mg of 7-nm diameter PbS NCs (acceptor #3) capped with oleic acid are added to the ZnSe NC solution. The mixture is stirred and then drop casted onto a glass plate and the solvent is evaporated to produce a solid form. The resulting mixture will have multiple narrow emission peaks in the "eyesafe" near-infrared from the multiple acceptors and can be excited in the ultraviolet.

What is claimed is:

1. A composition comprising one or more energy donors and one or more energy acceptors, wherein energy is transferred from the energy donor to the energy acceptor and wherein:
    a) the energy acceptor is a colloidal nanocrystal having a lower band gap energy than the energy donor;
    b) the energy donor and the energy acceptor are separated by a distance of 40 nm or less;
    c) wherein the average peak absorption energy of the acceptor is at least 20 meV greater than the average peak emission energy of the energy donor; and
    d) wherein the ratio of the number of energy donors to the number of energy acceptors is from about 2:1 to about 1000:1.

2. The composition of claim 1 wherein the composition has a volume percentage of nanocrystals greater than 1%.

3. The composition of claim 2, wherein the volume percentage of energy acceptors is at least 10%.

4. The composition of claim 1 wherein the ratio of the number of energy donors to the number of energy acceptors is from about 2:1 to about 20:1.

5. The composition of claim 1, wherein both the energy donor and the energy acceptor are monodisperse.

6. The composition of claim 1, wherein the energy donor is polydisperse and the energy acceptor is monodisperse.

7. The composition of claim 1, wherein the energy donor is ZnX, CdX, or combinations thereof, wherein X is selected from the group consisting of S, Se, Te and combinations thereof.

8. The composition of claim 1, wherein the energy acceptor is CdY, PbY, or combinations thereof, wherein Y is selected from the group consisting of S, Se, Te and combinations thereof.

9. The composition of claim 1, wherein the energy donor is CdSe and the energy acceptor is InAs.

10. The composition of claim 1, wherein the energy donor is CdSe and the energy acceptor is PbSe.

11. The composition of claim 1, wherein the energy donor is ZnSe and the energy acceptor is CdSe.

12. The composition, of claim 1, wherein the energy donor is the shell of a core-shell nanomaterial comprising ZnX, CdX or combinations thereof, wherein X is selected from the group consisting of S, Se, Te and combinations thereof, and the core comprises ZnY, CdY, PbY, wherein Y is selected from the group consisting of S, Se, Te and combinations thereof.

13. The composition of claim 1, wherein the energy donor is a dye molecule.

14. The composition of claim 1, further comprising from about 0.01% to about 5% of a dopant.

15. The composition of claim 2, wherein the composition is in the form of a dense film.

16. The composition of claim 15, wherein the dense film has a thickness of from about 1 nm to about 1 mm.

17. The composition of claim 15, wherein the dense film has a thickness of from about 1 mm to about 10 cm.

18. The composition of claim 16, wherein the dense film forms a component of a light emitting element.

19. The composition of claim 18, wherein the light emitting element is selected from the group consisting of an optical barcode, scintillator, an optical tag, an LED color-conversion element, an LED, or combinations thereof.

20. The composition of claim 1, wherein the average peak emission energy of the donor has an FWHM of at least 30 meV.

21. The composition of claim 1, wherein the average peak absorption energy of the donor has a FWHM from about 100 meV to about 500 meV.

22. The composition of claim 1 wherein the average peak emission energy of the energy donor and the energy acceptor has an FWHM of about 150 meV or less.

23. The composition of claim 1, wherein said composition is in the form of a solution and wherein the energy donor and the energy acceptor are attached by means of a covalent linkage.

24. A white-light emitting element comprising a composition in the form of a dense film, said composition comprising one or more nanocrystal energy donors and one or more nanocrystal energy acceptors, wherein energy is transferred from the energy donor to the energy acceptor and wherein:
    a) the energy acceptor molecule has a lower band gap energy than the energy acceptor;
    b) the energy donor and the energy acceptor are separated by a distance of 40 nm or less;
    c) wherein the average peak absorption energy of the acceptor molecule is at least 20 meV greater than the average peak emission energy of the energy donor;
    d) wherein the ratio of the number of energy donors to the number of energy acceptors is about 2:1 to about 100:1; and
    e) the film has a thickness of from about 1 nm to about 1 mm.

25. The white-light emitting element of claim 24, wherein the composition has a volume percentage of nanocrystals of from about 1% to about 75%.

26. The white-light emitting element of claim 24, wherein the volume percentage of energy acceptors is at least 10%.

27. The white-light emitting element of claim 24, wherein both the energy donor and the energy acceptor are monodisperse.

28. The white-light emitting element of claim 24, wherein the energy donor is polydisperse and the energy acceptor is monodisperse.

29. The white-light emitting element of claim 24, wherein the energy donor is ZnX, CdX, or combinations thereof, wherein X is selected from the group consisting of S, Se, Te and combinations thereof.

30. The white-light emitting element of claim 24, wherein the energy acceptor is CdY, PbY, or combinations thereof, wherein Y is selected from the group consisting of S, Se, Te and combinations thereof.

31. The white-light emitting element of claim 24, wherein the energy donor is CdSe and the energy acceptor is InSb.

32. The white-light emitting element of claim 24, wherein the energy donor is CdSe and the energy acceptor is PbSe.

33. The white-light emitting element of claim 24, wherein the energy donor is ZnSe and the energy acceptor is CdSe.

34. The white-light emitting element of claim 24, wherein the energy donor molecule is a dye molecule.

* * * * *